(12) United States Patent
Harrison (10) Patent No.: US 10,263,568 B2
(45) Date of Patent: Apr. 16, 2019

(54) RADIO FREQUENCY FEEDBACK POWER AMPLIFIERS

(71) Applicant: Avago Technologies General IP (Singapore) Pte. Ltd., Singapore (SG)

(72) Inventor: Jeffrey Norwood Harrison, Epping (AU)

(73) Assignee: Avaga Technologies International Sales PTE. Limited, Singapore (SG)

( * ) Notice: Subject to any disclaimer, the term of this patent is extended or adjusted under 35 U.S.C. 154(b) by 0 days.

(21) Appl. No.: 15/801,234

(22) Filed: Nov. 1, 2017

(65) Prior Publication Data

US 2018/0241358 A1    Aug. 23, 2018

Related U.S. Application Data

(60) Provisional application No. 62/462,891, filed on Feb. 23, 2017.

(51) Int. Cl.
| | |
|---|---|
| *H03F 1/34* | (2006.01) |
| *H03F 1/32* | (2006.01) |
| *H03F 3/19* | (2006.01) |
| *H03F 3/21* | (2006.01) |
| *H04B 1/04* | (2006.01) |

(52) U.S. Cl.
CPC ............ *H03F 1/32* (2013.01); *H03F 3/19* (2013.01); *H03F 3/21* (2013.01); *H03F 2200/129* (2013.01); *H03F 2200/144* (2013.01); *H03F 2200/451* (2013.01); *H03F 2201/3215* (2013.01); *H04B 1/04* (2013.01); *H04B 2001/0408* (2013.01)

(58) Field of Classification Search
CPC ........................................................ H03F 1/34
USPC .................................................. 330/294, 310
See application file for complete search history.

(56) References Cited

U.S. PATENT DOCUMENTS

| | | | |
|---|---|---|---|
| 2,102,671 A | 12/1937 | Black | |
| 8,594,605 B2 * | 11/2013 | Katsube | H03H 11/1252 327/552 |
| 8,952,755 B2 * | 2/2015 | Kim | H03F 3/21 330/140 |
| 2004/0080372 A1 * | 4/2004 | Chen | H03F 1/223 330/311 |
| 2011/0105067 A1 * | 5/2011 | Wilson | H03G 1/0017 455/150.1 |

(Continued)

OTHER PUBLICATIONS

Black, "Stabilized Feedback Amplifers," Bell System Technical Journal, Jan. 1934, pp. 1-18.

(Continued)

*Primary Examiner* — Henry Choe
(74) *Attorney, Agent, or Firm* — Morgan, Lewis & Bockius LLP (57) ABSTRACT

A linearized power amplifier apparatus includes a number of amplifying stages to amplify a radio-frequency (RF) signal, and a feedback loop including a feedback circuit coupled between an output port of a last amplifying stage and an input port of a first amplifying stage. The feedback loop has a loop gain frequency response that peaks at a frequency approximately equal to a frequency of the RF signal. The feedback loop can provide a linear combination of a feedback signal and the RF signal to the input port of the first amplifying stage.

20 Claims, 9 Drawing Sheets

(56) References Cited

U.S. PATENT DOCUMENTS

| | | | | |
|---|---|---|---|---|
| 2011/0115566 A1* | 5/2011 | Moon | ............... | H03F 3/45188 331/16 |
| 2011/0212692 A1* | 9/2011 | Hahn | ................. | H04B 1/525 455/63.1 |

OTHER PUBLICATIONS

Bode, "Network Analysis and Feedback Amplifier Design," Van Nostrand, 1945, Section 19.5: Amplifiers with Band-Pass Transmission Characteristics, pp. 502-509.

Bruene, "Distortion Reducing Means for Single-Sideband Transmitters," Proceedings of the IRE, Dec. 1956, vol. 44, pp. 1760-1765.

Cripps, "Advanced Techniques in RF Power Amplifier Design," Artech House, 2002, Chapter 4 "Feedback Techniques" pp. 111-121.

Cripps, "RF Power Amplifiers for Wireless Communications," 2nd edition, Artech House, 2006, Section 14.4.1, pp. 419-420.

Ezzeddine et al., "An MMAC C-Band FET Feedback Power Amplifier," IEEE Transactions on Microwave Theory and Techniques, Apr. 1990, vol. 38, No. 4, pp. 350-357.

Grebennikov, "RF and Microwave Transmitter Design," John Wiley & Sons, 2011, Section 12.5 "Feedback Linearization" pp. 672-678.

Hsieh et al., "A S-Band High Power Feedback Amplifier," IEEE MTT-S International Microwave Symposium, 1977, pp. 182-184.

Lurie, "Feedback Maximization," Artech House, 1986. Section 1.1.5 "Balanced Bridge" pp. 14-16; and Section 2.4.1 "Bode Optimal Cut-Off" pp. 88-101.

Orr, "The Radio Handbook, 15th edition," Editors and Engineers, Summerland CA, 1959. (Chapter 14: R-F Feedback).

Pappenfus et al., "Single Sideband Principles and Circuits," Mc-Graw Hill, 1964, Chapter 13-8 through Chapter 14, pp. 195-221.

Thies, "A Transistor Amplifier with Heavy Feedback for 12-Channel Open Wire Carrier Systems," Telecommunication Journal of Australia, Feb. 1960, vol. 12, No. 3, pp. 187-194.

Trask, "Distortion Improvement of Lossless Feedback Amplifiers Using Augmentation," IEEE 42nd Midwest Symposium on Circuits and Systems, 1999, vol. 2, pp. 951-954.

* cited by examiner

RADIO FREQUENCY FEEDBACK POWER AMPLIFIERS

CROSS-REFERENCE TO RELATED APPLICATIONS

This application claims the benefit of priority under 35 U.S.C. §§ 119 from U.S. Provisional Patent Application 62/462,891 filed Feb. 23, 2017, which is incorporated herein by reference in its entirety.

TECHNICAL FIELD

The present description relates generally to integrated circuits, and more particularly, to radio frequency (RF) feedback power amplifiers.

BACKGROUND

Wireless communication increasingly uses higher-order modulations such as 256QAM modulation scheme to improve spectral efficiency. This requires lower distortion (e.g., lower error vector magnitude and lower spectral regrowth) from all radio circuit blocks, including the transmitter power amplifier and the power amplifier driver that precedes the transmitter power amplifier. Making power amplifier stages both highly linear and power efficient is not an easy task, particularly in CMOS technology. Therefore, various linearization techniques are used to achieve linearity, among which digital predistortion (DPD) technique is generally considered a desired technique. There are a variety of other techniques that are considered reasonable, for example, feedforward, analog predistortion, indirect (e.g., Cartesian frequency translation, envelope, etc.) feedback.

DPD technique is the most widely adopted linearization technique. However, DPD requires widening the transmitter baseband filter bandwidth (e.g. from 9 MHz to 60 MHz for WLAN) to pass the distortion-cancelling energy, and increasing the peak-to-average ratio of the signal in the transmit (TX) chain to cancel the PA compression. Both of these effects increase the noise contribution from baseband blocks such as a digital-to analog (DAC) block, which may leak into adjacent cellular bands.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and configurations are described providing a highly linear and efficient power amplifier circuit. It is understood that a challenge associated with direct radio-frequency (RF) feedback is to achieve useful loop gain without excessive phase lag and hence instability with reactive loads. The power amplifier circuit of the subject technology leverages a direct RF feedback having a loop gain peaking at the signal frequency. The subject technology achieves the linearity through the use of a dissipative output network that reduces the phase angle associated with a load impedance and a feedback network, and a manner in which the feedback taps off before the output network. The disclosed linearized RF feedback amplifier can be realized in a number of technologies such as complementary metal-oxide-semiconductor (CMOS) and bipolar (e.g., Si—Gi) technologies.

Figure 1:
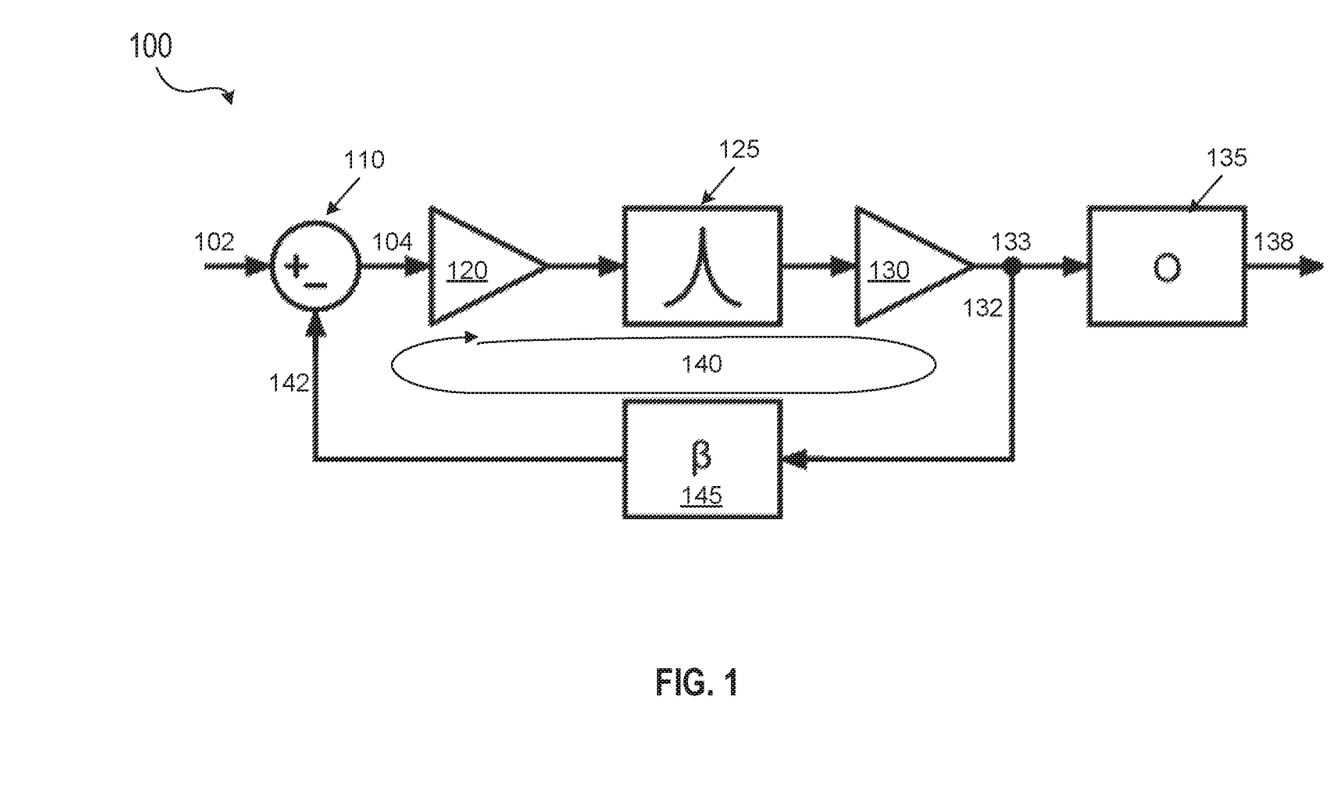
FIG. 1 is a block diagram illustrating an example radio-frequency (RF) feedback power amplifier circuit, according to aspects of the subject technology.

FIG. 1 is a block diagram illustrating an example radio-frequency (RF) feedback power amplifier circuit 100, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The RF feedback power amplifier circuit 100 features a negative feedback for signals of microwave frequencies (e.g. 2.4 GHz). The RF feedback power amplifier circuit 100 is linearized using a direct RF feedback loop and a dissipative output network that reduces the phase angle associated with a load impedance. The RF feedback power amplifier circuit 100 includes first and second amplifying stages 120 and 130, a frequency-selective network 125, an output network 135 and a feedback loop 140 including a feedback circuit 145. In general, a count of the amplifying stages is not limited to two and can be more than two (e.g., 3, 4 or more). The first amplifier stage 120 can be a power amplifier driver (PAD) and the second amplifier stage 130 can be a power amplifier (PA). The first amplifier stage receives an input signal 104 and amplifies the received input signal 104.

The frequency-selective network 125 is tunable and can be tuned to provide a large feedback loop gain at or near a frequency of an RF signal 102 (e.g., at about 2.4 GH). In one or more implementations, the frequency-selective network 125 can be a linear, time-invariant, bandpass frequency-selective network. The frequency-selective network 125 is between the first and second amplifying stages 120 and 130. In some implementations, the frequency-selective network 125 can be used before the first amplifier stage 120. The feedback loop 140 does not pass through the output network 135 and includes a feedback circuit 145 with a feedback factor β. The feedback loop 140 samples a voltage at an output node 133 of the second amplifying stage 130 and provides a linear combination of a feedback signal 142 and the RF signal 102 to an input node 110 of the first amplifying stage 120. In some implementations, the input node 110 can be an input port of the first amplifying stage 120, and the output node 133 can be an output port of the second amplifying stage 130. The linear combination of the feedback signal 142 and the RF signal 102 provides the input signal 104 of the first amplifying stage 120. In one or more implementations, the linear combination of the feedback signal 142 and the RF signal 102 may be frequency dependent, for example, when the frequency of the feedback signal 142 is not the same as the RF signal 102. The feedback factor β is a ratio of the feedback signal 142 to the sampled voltage 132. And the feedback loop gain is a product of the feedback factor β and amplifications (gains) of the first and amplifying stages 120 and 130. The output network 135 may include some degree of energy dissipation that enables reducing a variation in a load impedance angle of a reactive load seen from an output node (e.g., port) 138 of the output network 135. Reducing the load impedance angle variation is an important aspect of the subject disclosure, and does not introduce a significant loss. For example, an output balun transformer has about 1.5 dB parasitic loss while still being useful. Desirably, the loss would be quite low at the RF signal frequency (e.g., 2.4 GHz) for efficiency reasons, and may increase away from the RF signal frequency.

Figure 2A:
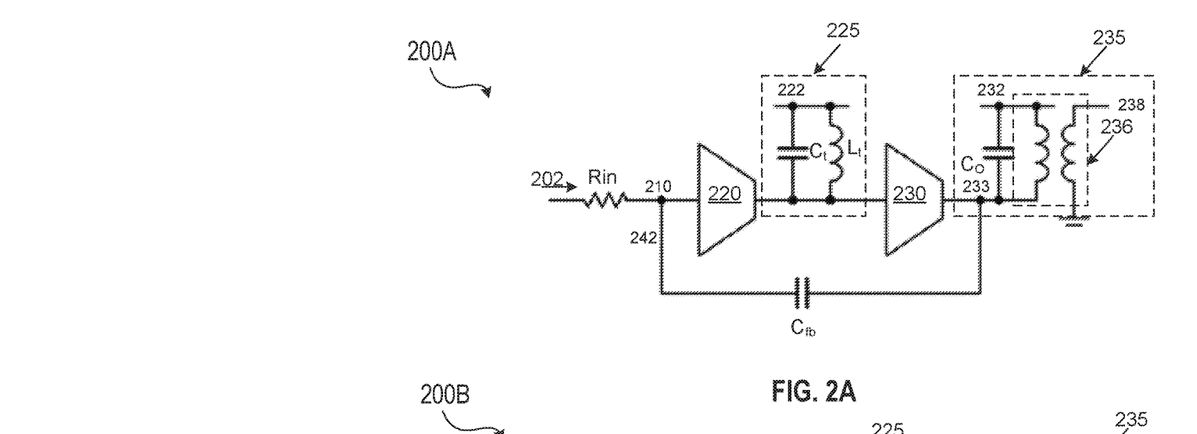
FIGS. 2A and 2B are schematic diagrams illustrating example circuit level implementations of the RF feedback power amplifier circuit of FIG. 1, according to aspects of the subject technology.
Figure 2B:
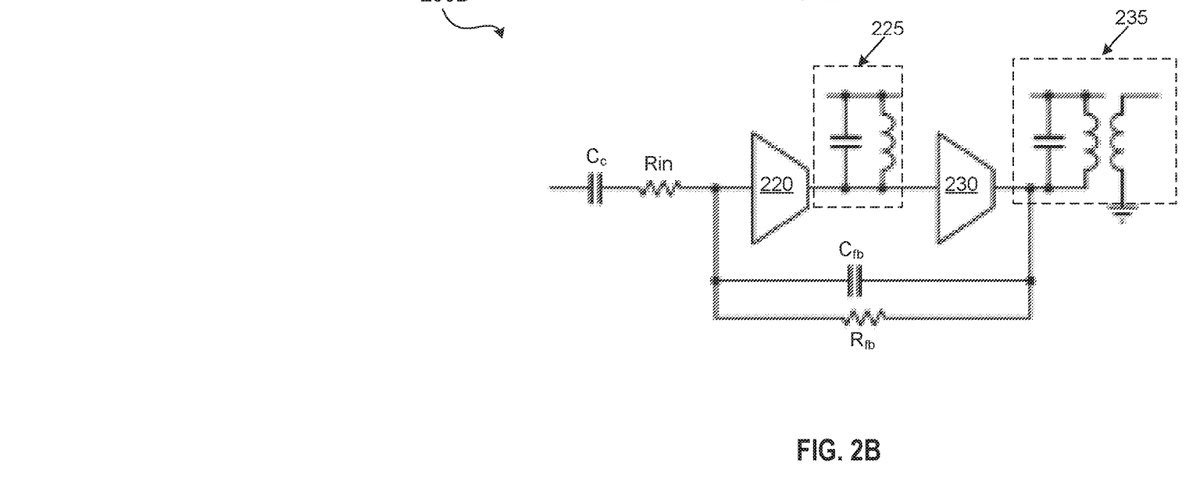

FIGS. 2A and 2B are schematic diagrams illustrating example circuit level implementations 200A and 200B of the RF feedback power amplifier circuit 100 of FIG. 1, according to aspects of the subject technology. The circuit level implementations 200A shows that the linearized RF feedback power amplifier circuit 100 of FIG. 1 can be implemented using integrated circuit technology transconductance amplifiers and reactive elements. For example, the first and second amplifier stages 120 and 130 of FIG. 1 are implemented using the transconductance amplifiers 220 and 230, and the frequency-selective network 125 and the output network 135 are realized using the frequency-selective network 225 and the output network 235. The frequency-selective network 225 is an LC tank formed of a capacitor C and an inductor L and can be tuned to make the feedback loop peak at or near the frequency of the RF signal (e.g., 2.4 GHz). A node (e.g., port) 222 of the frequency-selective network 225 can be connected to a supply voltage (e.g., $V_{dd}$). The output network 235 includes a capacitor $C_o$ and a transformer 236 that can be to some extent dissipative to reduce a variation in a load impedance angle of a reactive load seen from an output node (e.g., port) 238 of the output network 235. In some implementations, the transformer 236 can be a balanced-to-unbalanced transformer (e.g., balun). A node (e.g., port) 232 of the frequency-selective network 235 can also be connected to the supply voltage (e.g., $V_{dd}$).

The feedback circuit 145 of FIG. 1 is implemented using a feedback capacitor $C_{fb}$, which is coupled between an output node (e.g., port) 233 of the transconductance amplifier 230 and an input node (e.g., port) 210 of the transconductance amplifier 220. The feedback provided by the capacitor $C_{fb}$ is a voltage-current feedback that samples a voltage at the output node 233 and provides a feedback signal 242 (e.g., a current) at the input node 210. The feedback signal 242 is linearly mixed with a RF current signal 202 passing through an input resistance Rin at the input node 210. In one or more implementations, at least some passive circuit elements such as a capacitor $C_t$ of the frequency-selective network 225 and the capacitor $C_{fb}$ of the feedback network can be realized using switched-capacitors and their respective capacitance values can be adjusted by switched tuning.

The circuit level implementation 200B is similar to the circuit level implementation 200A, except that a feedback resistor $R_{fb}$ is connected in parallel to the feedback capacitor $C_{fb}$ of the feedback network. The feedback resistor $R_{fb}$ (e.g., with a resistance of a few KΩ) can provide a small phase lead to cancel the lag in the transconductance amplifiers 220 and 230 (which may be implemented using cascode transistors). In some implementations, a coupling capacitor $C_c$ may be coupled in series with the input resistor $R_{in}$ to provide AC coupling between an input circuitry and the transconductance amplifier 220. The circuit level implementation 200A and 200B are single-ended implementations that can be fabricated in a bipolar technology such as the SiGi technology.

Figure 3:
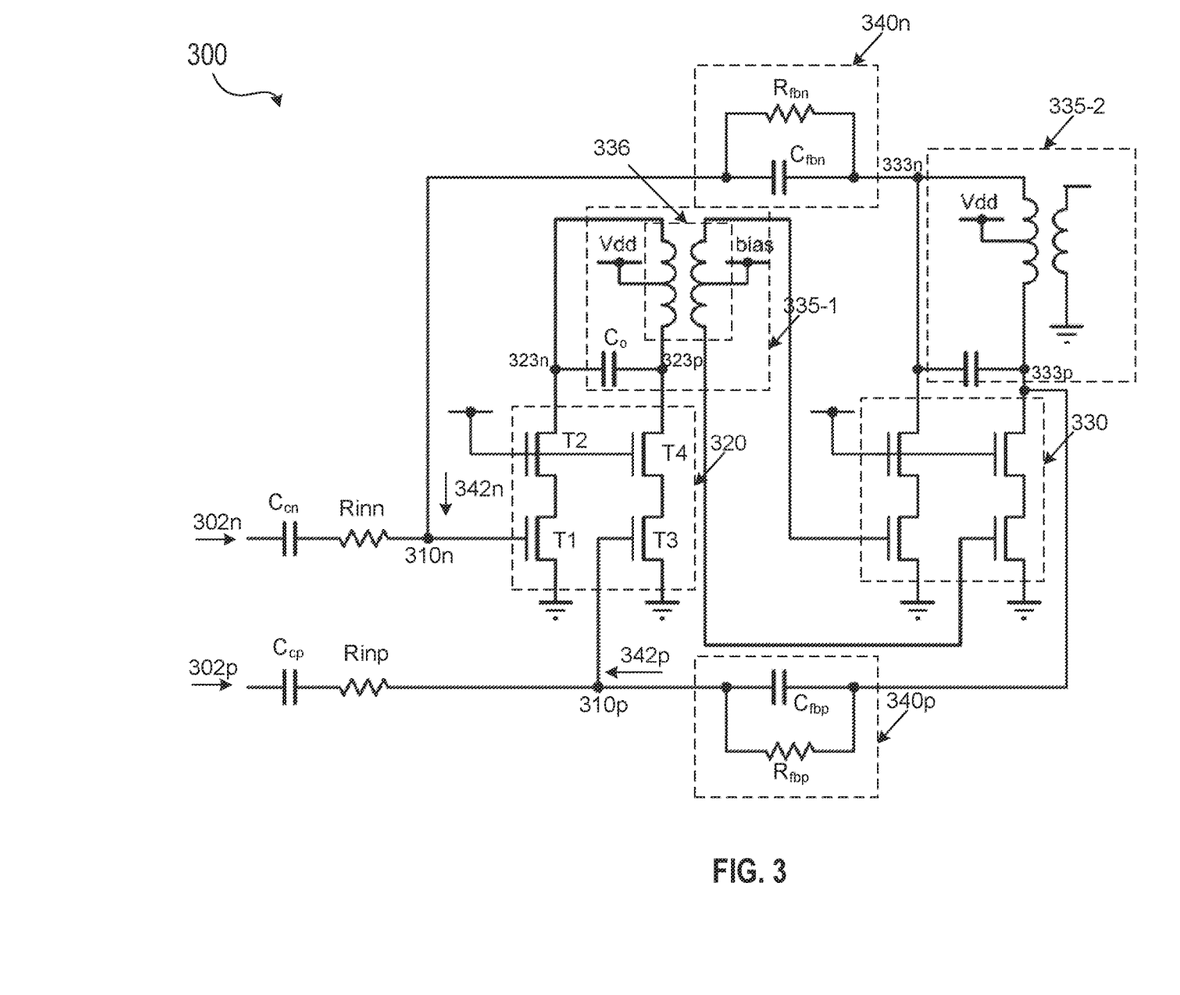
FIG. 3 is a schematic diagram illustrating an example circuit level implementation of a differential RF feedback power amplifier, according to aspects of the subject technology.

FIG. 3 is a schematic diagram illustrating an example circuit level implementation of a differential RF feedback power amplifier 300, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The differential RF feedback power amplifier 300 is a differential implementation of the RF feedback power amplifier circuit 100 of FIG. 1 and can be fabricated using CMOS technology. The differential RF feedback power amplifier 300 includes first and second amplifier stages 320 and 330, feedback networks 340n and 340p and output networks 335-1 and 335-2. The first differential amplifier stage 320 is a differential cascode stage including a first cascode pair formed by transistors T1 and T2 and a second cascode pair formed by transistors T3 and T4. The second differential amplifier stage 330 is similar to the first differential amplifier stage 320.

The feedback networks 340n and 340p are similar and are coupled between respective output nodes (e.g., ports) 333n and 333p of the second differential amplifier stage 330 and respective input nodes (e.g., ports) 310n and 310p of the first differential amplifier stage 320. The feedback network 340n includes a parallel combination of a feedback capacitor $C_{fbn}$ and a feedback resistor $R_{fbn}$. Similarly, the feedback network 340p includes a parallel combination of a feedback capacitor $C_{fbp}$ and a feedback resistor $R_{fbp}$. The feedback provided by the feedback networks 340n and 340p is a voltage-current negative feedback that samples output voltages at the output nodes 333n and 333p and provide feedback current signals 342n and 342p at the respective input nodes 310n and 310p. The input nodes 310n further receive an RF current signal 302n through an input coupling capacitor $C_{cn}$ and an input resistance $R_{inn}$, and the input nodes 310p further receive an RF current signal 302p through an input coupling capacitor $C_{cp}$ and an input resistance $R_{inp}$.

The output networks 335-1 and 335-2 are similar and are respectively coupled to differential output nodes (e.g., ports) 323n and 323p of the first differential amplifier stage 320 and to differential output nodes 333n and 333p of the second differential amplifier stage 330. The output network 335-1 includes a capacitor $C_o$ and a transformer 336. In some implementations, the transformer 336 can be a balanced-to-unbalanced transformer (e.g., balun). In one or more implementations, the output network 335-1 includes a Zobel network, or a reflection-less filter, which are known circuits. The middle points of the primary and secondary windings of the transformer 336 are connected to supply voltage $V_{dd}$ and a bias voltage, respectively. The output network 335-2 is similar to the output network 335-1.

Figure 4:
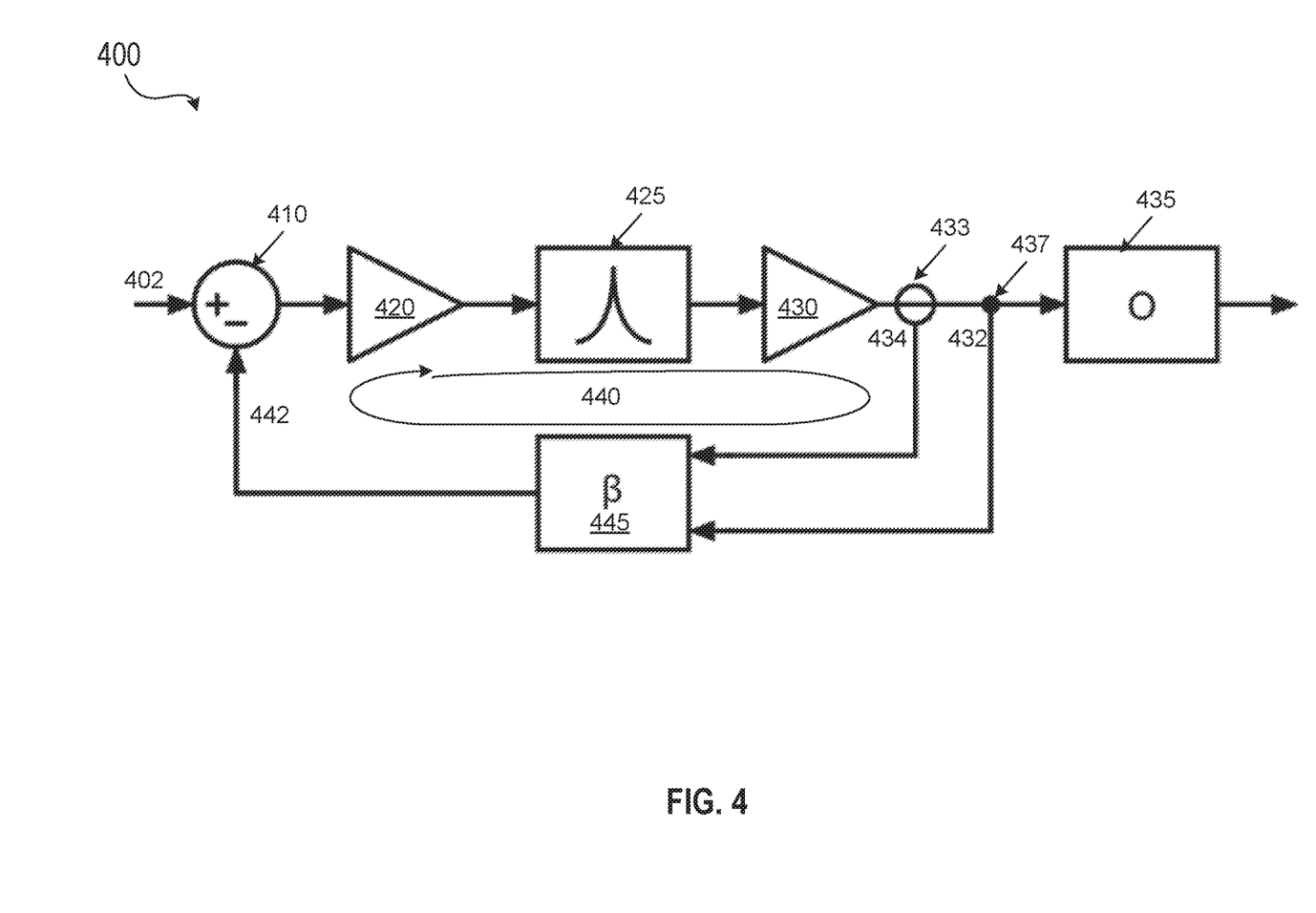
FIG. 4 is a block diagram illustrating an example RF feedback power amplifier circuit with a current and voltage feedback loop, according to aspects of the subject technology.

FIG. 4 is a block diagram illustrating an example RF feedback power amplifier circuit 400 with a current and voltage feedback loop, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The RF feedback power amplifier circuit 400 is a linearized negative feedback power amplifier that includes both current and voltage feedback. The RF feedback power amplifier circuit 400 is similar to the RF feedback power amplifier circuit 100 of FIG. 1, except for the feedback loop 440 that is different from the feedback loop 140 of FIG. 1, as described herein. The RF feedback power amplifier circuit 400 includes first and second amplifying stages 420 and 430, a frequency-selective network 425 and an output network 435 that are respectively similar to the first and second amplifying stages 120 and 130, the frequency-selective network 125 and the output network 135 of FIG. 1 described above. In some aspects, a count of the amplifying stages may not be limited to two and can, for example, be 3, 4 or more. In one or more implementations, the frequency-selective network 425 may be coupled before the first amplifier stage 420.

The feedback loop 440 is mixed feedback loop with a feedback factor β that samples a voltage signal 432 and a current signal 434 from an output of the second amplifier stage 430. The voltage signal 432 is sampled at a node (e.g., port) 437 and the current signal 434 is sampled using a current sensing circuit (or device) 433. The current sensing circuit 433 can be a transformer, a bridge circuit (e.g., a capacitor bridge) or a directional coupler. The feedback signal 442 is generated based on the voltage signal 432, the current signal 434 and the feedback factor β of a feedback circuit 445 and is linearly mixed with an RF signal 402 using a summation circuit 410. As shown in FIG. 4, the sampling of the voltage signal 432 and the current signal 434 is before the output network 435, such that the output network 435 is not part of the feedback loop 440.

Figure 5:
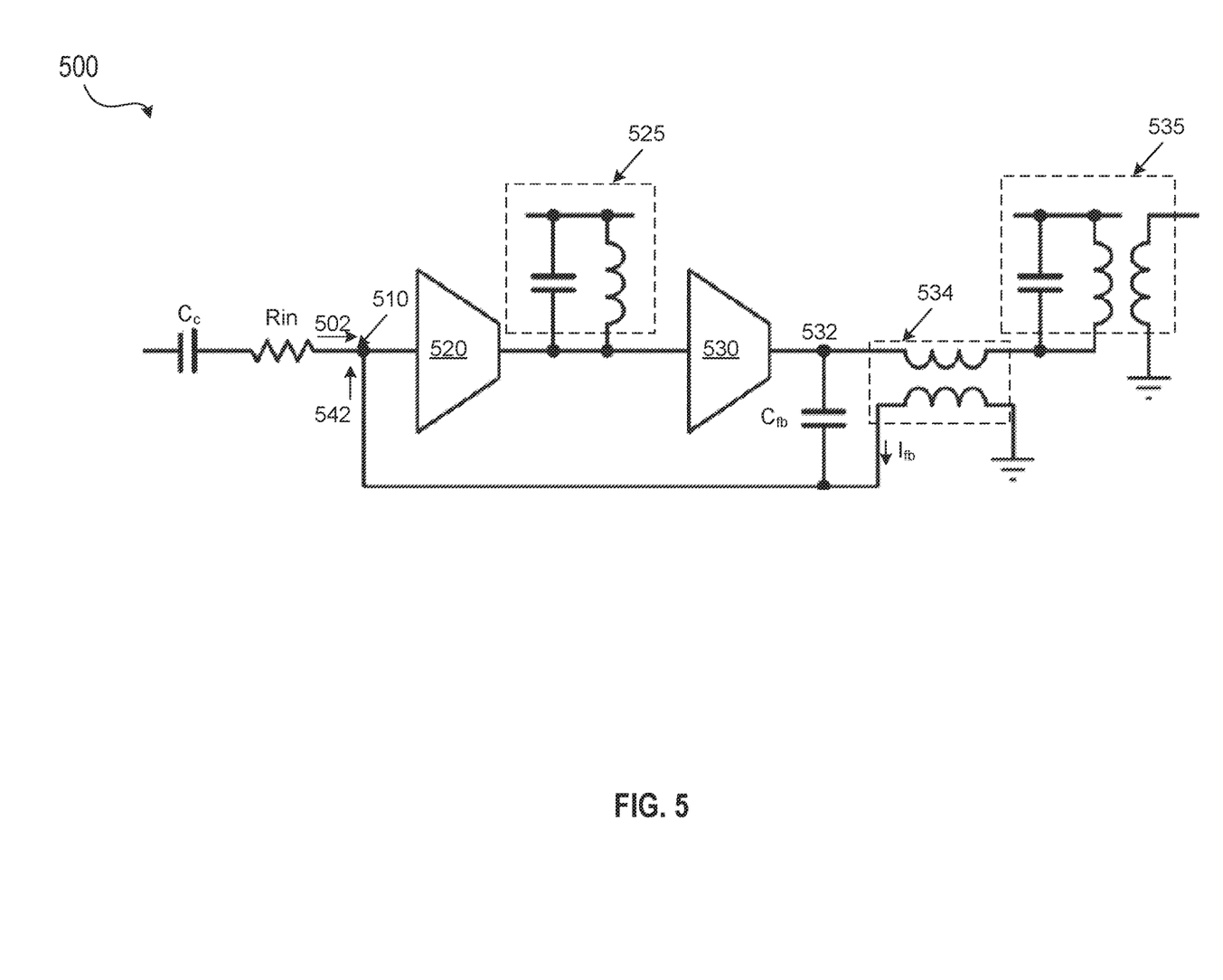
FIG. 5 is a schematic diagram illustrating an example circuit level implementation of the RF feedback power amplifier circuit of FIG. 4, according to aspects of the subject technology.

FIG. 5 is a schematic diagram illustrating an example circuit level implementation 500 of the RF feedback power amplifier circuit 400 of FIG. 4, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The circuit level implementation 500 is an example implementation of the RF feedback power amplifier circuit 400 of FIG. 4 and includes the first and second amplifying stages 520 and 530, a frequency-selective network 525 and an output network 535 that are example realization of the first and second amplifying stages 420 and 430, the frequency-selective network 425 and the output network 435 of FIG. 4. In some implementation, the amplifying stages 520 and 530 are single-ended transconductance amplifiers and can be realized, for example, in bipolar (e.g., Si—Ge) technology. The frequency-selective network 525 and the output network 535 are similar to the frequency-selective network 225 and an output network 235 of FIG. 2A, described above.

The negative feedback loop 440 of FIG. 4 is implemented using a feedback circuit including the feedback capacitor $C_{fb}$ and the transformer 534. The feedback capacitor $C_{fb}$ samples an output voltage of the second amplifying stage 530 at a node (e.g., port) 532. The transformer 534 samples an output current of the second amplifying stage 530 before the output stage 535 and provides a feedback current $I_{fb}$. The feedback current $I_{fb}$, in conjunction with a current of the feedback capacitor $C_{fb}$, form the feedback current signal 542, which is linearly mixed, at a node (e.g., port) 510, with an RF current signal 502 passing through the input resistor Rin and the coupling capacitor $C_c$.

Figure 6:
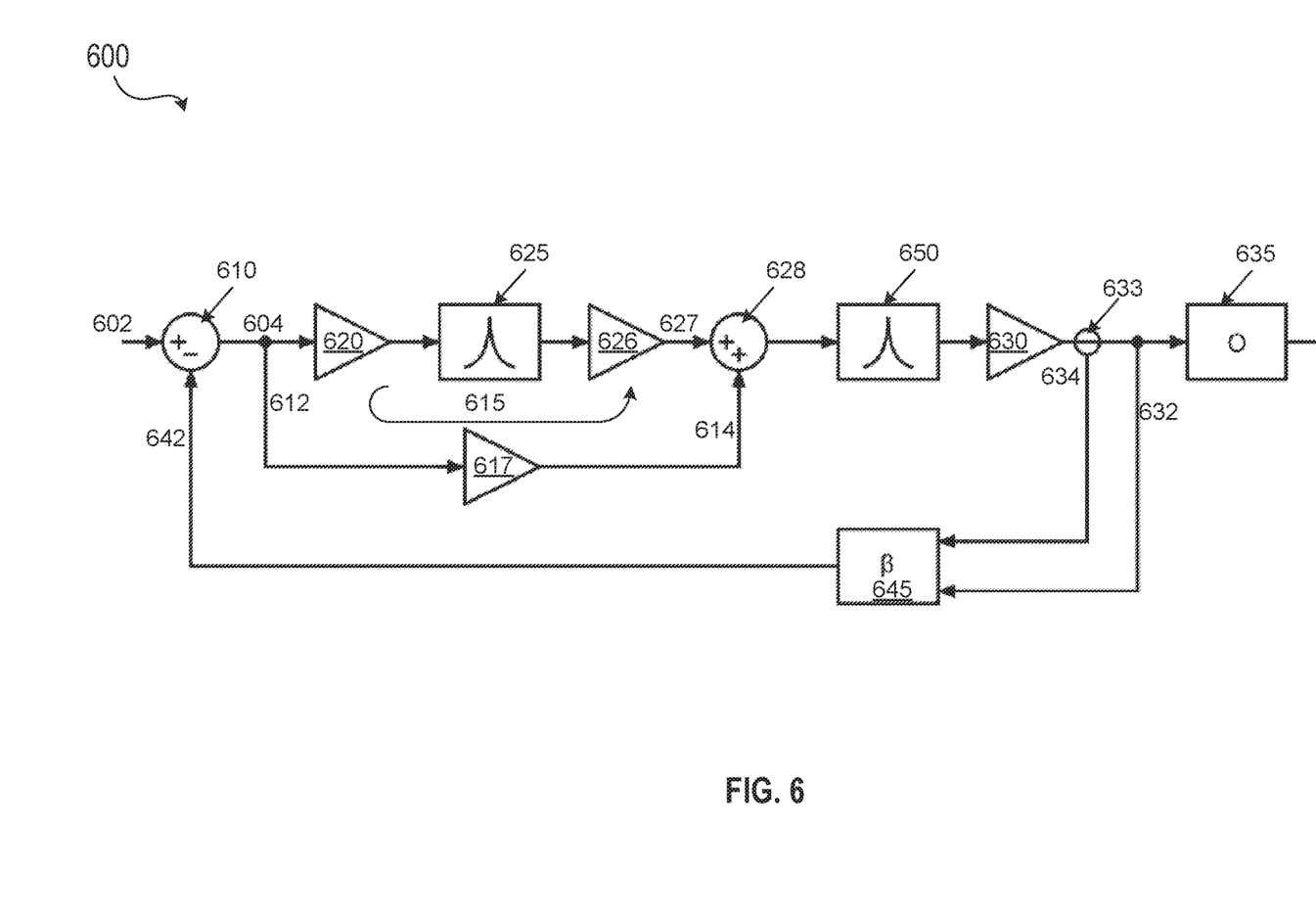
FIG. 6 is a block diagram illustrating an example multi-stage RF feedback power amplifier circuit with a current and voltage feedback loop and a feedforward loop, according to aspects of the subject technology.

FIG. 6 is a block diagram illustrating an example multistage RF feedback power amplifier circuit 600 with a current and voltage feedback loop and a feedforward loop, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The example multistage RF feedback power amplifier circuit 600 includes a number of amplifying stages, for example, first, second and third amplifying stages 620, 626 and 630, first and second frequency selective networks 625 and 650, a feedforward amplifier 615, a feedback circuit 645 and an output network 635. In some implementations, the first frequency selective networks 625 can be coupled to an input node (e.g., port) of the first amplifying stage 620.

The first, second and third amplifying stages 620, 626 and 630 are similar to the first and second amplifier stages 420 and 430 of FIG. 4. Further, the first and second frequency selective networks 625 and 650 and the output network 635 are respectively similar to the selective network 425 and the output network 435 of FIG. 4 and can be realized similar to the selective network 225 and the output network 235 of FIG. 2. The feedback circuit 645 samples output voltage and current of the third amplifier stage 630. A current sensing circuit 633 (e.g., a transformer, a bridge circuit or a directional coupler) produces a sampled current 634, which is used by the feedback circuit 645, along with a sampled voltage 632, to generate the current feedback signal 642. The current feedback signal 642 is linearly mixed by a summation circuit 610 with an RF signal (e.g., current signal) 602. A feedforward loop 615 including the feedforward amplifier 617 feeds a sample 612 of the input signal 604 to a summation circuit 628 to be mixed (e.g., linearly) with an output signal 627 of the second amplifier stage 626. The feedforward loop 615 bypasses the first frequency-selective network 625 to enhance stability of the multistage amplifier. The feedforward loop 615 is effective, in particular, when more than one frequency-selective network (e.g., 625 and 650) ae present.

Figure 7:
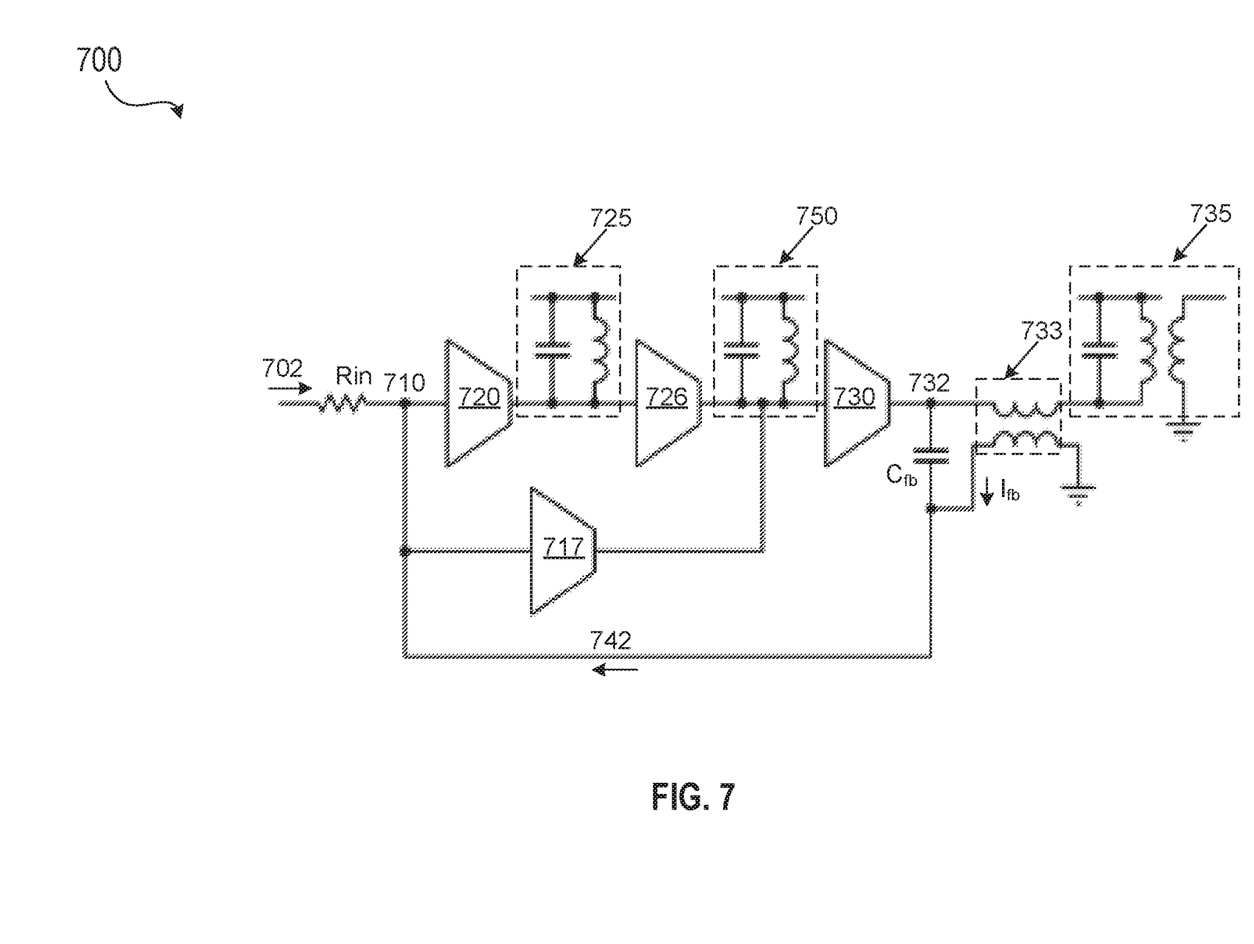
FIG. 7 is a schematic diagram illustrating an example circuit level implementation of the multistage RF feedback power amplifier circuit of FIG. 6, according to aspects of the subject technology.

FIG. 7 is a schematic diagram illustrating an example circuit level implementation 700 of the multistage RF feedback power amplifier circuit of FIG. 6, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The circuit level implementation 700 is an example implementation of the multistage RF feedback power amplifier circuit 600 of FIG. 6 and includes first, second and third amplifying stages 720, 726 and 730, frequency-selective networks 725 and 750, a feedforward amplifier 717 and an output network 735. The frequency-selective networks 725 and 750 and the output network 735 are example realization of the frequency-selective networks 625 and 650 and the output network 635 of FIG. 6. In some implementation, the amplifying stages 720, 726 and 730 and the feedforward amplifier 715 are single-ended transconductance amplifiers and can be realized, for example, in bipolar (e.g., Si—Ge) technology. The frequency-selective networks 725 and 750 and the output network 735 are similar to the frequency-selective network 225 and an output network 235 of FIG. 2A, described above.

The negative feedback loop 640 of FIG. 6 is implemented using the feedback capacitor $C_{fb}$ and the transformer 733. The feedback capacitor $C_{fb}$ samples an output voltage of the second amplifying stage 730 at a node (e.g., port) 732. The transformer 733 samples an output current of the second amplifying stage 730 before the output stage 735 and provides a feedback current $I_{fb}$. The feedback current $I_{fb}$, in conjunction with a current of the feedback capacitor $C_{fb}$ form the feedback current signal 742, which is linearly mixed, at a node (e.g., port) 710, with an RF current signal 702 passing through the input resistor Rin.

Figure 8:
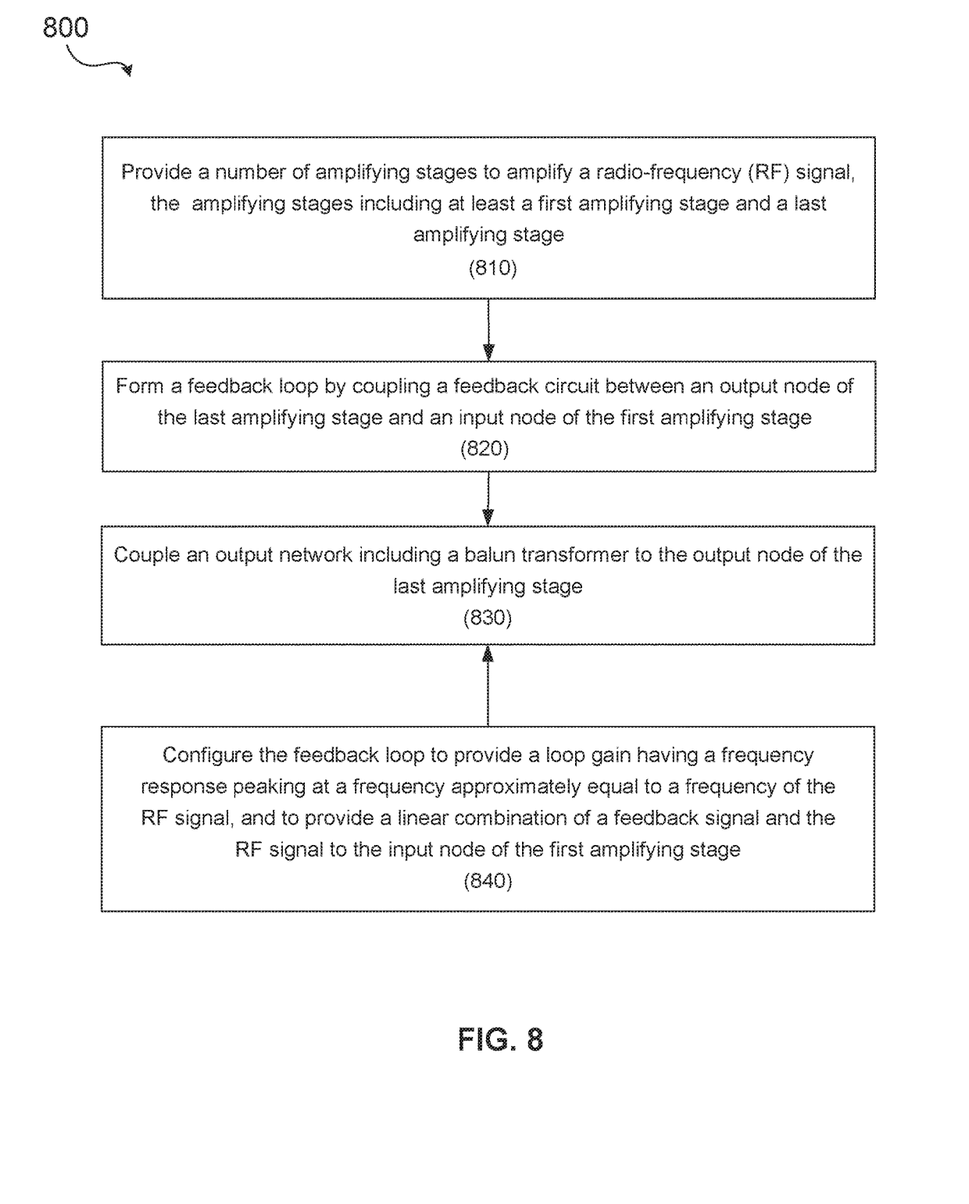
FIG. 8 is a flow diagram illustrating an example method of providing an RF feedback power amplifier circuit, according to aspects of the subject technology.

FIG. 8 is a flow diagram illustrating an example method of providing an RF feedback power amplifier circuit, according to aspects of the subject technology. For explanatory purposes, the method 800 is primarily described herein with reference to RF feedback power amplifier circuits 100 and 200A of FIGS. 1 and 2A. However, the method 800 is not limited to the RF feedback power amplifier circuits 100 and 200A of FIGS. 1 and 2A, and one or more blocks (or operations) of the method 800 may be performed by one or more other components of the RF feedback power amplifier circuits 100 and 200A of FIGS. 1 and 2A. Further for explanatory purposes, the blocks of the example method 800 are described herein as occurring in serial, or linearly. However, multiple blocks of the example method 800 may occur in parallel. In addition, the blocks of the example method 800 need not be performed in the order shown and/or one or more of the blocks of the example method 800 need not be performed.

The method 800 includes providing a number of amplifying stages (e.g., 120 and 130 of FIG. 1) to amplify a radio-frequency (RF) signal (e.g., 102 of FIG. 1), the amplifying stages include at least a first amplifying stage (e.g., 120 of FIG. 1) and a last amplifying stage (e.g., 130 of FIG. 1) (810). The method 800 further includes forming a feedback loop (e.g., 140 of FIG. 1) by coupling a feedback circuit (e.g., 145 of FIG. 1) between an output port (e.g., 133 of FIG. 1) of the last amplifying stage and an input port (e.g., 110 of FIG. 1) of the first amplifying stage (820). An output network (e.g., 135 of FIG. 1) including a balun transformer (e.g., 236 of FIG. 2) is coupled to the output port of the last amplifying stage. (830) The feedback loop can provide a loop gain having a frequency response peaking at a frequency approximately equal to a frequency of the RF signal, and can further provide a linear combination of a feedback signal (e.g., 142 of FIG. 1) and the RF signal to the input port of the first amplifying stage (840). The output network is out of the feedback loop.

Figure 9:
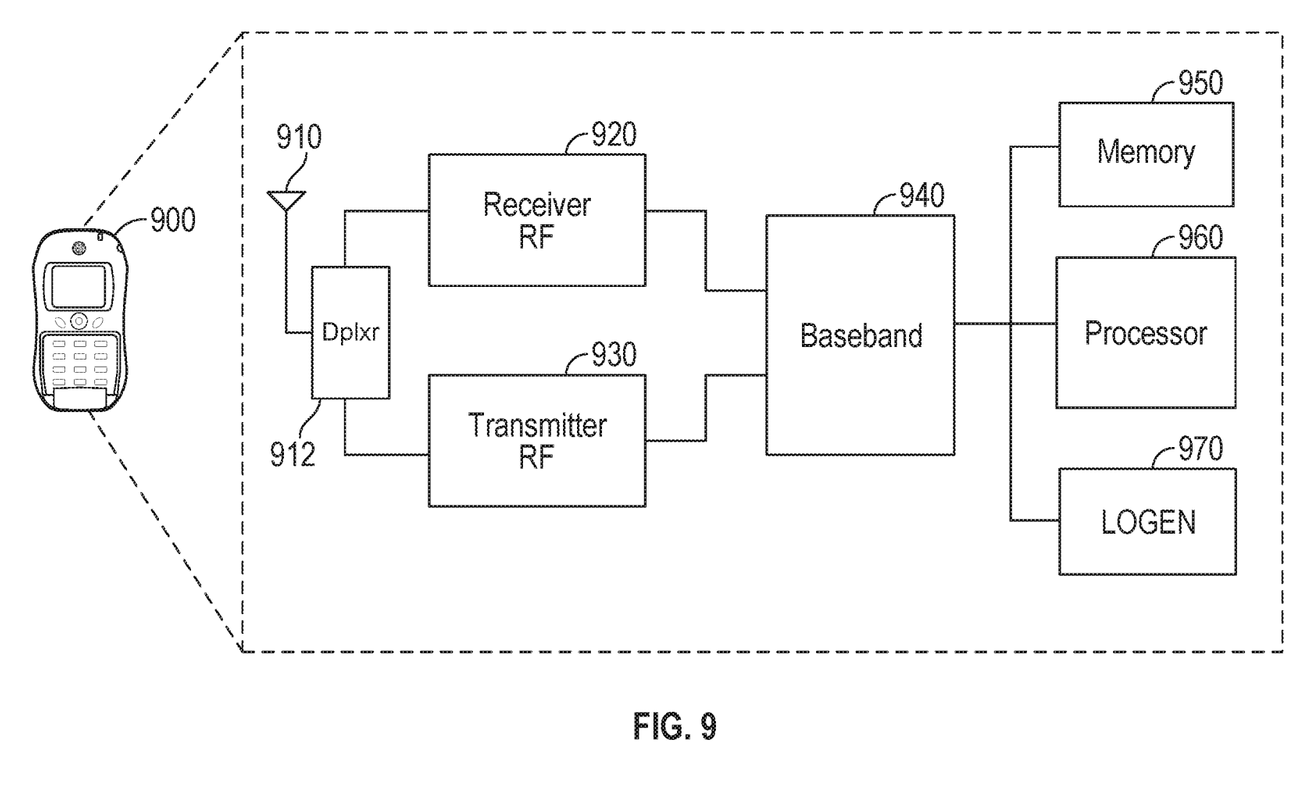
FIG. 9 is a block diagram illustrating an example wireless communication device in accordance with one or more implementations of the subject technology.

FIG. 9 is a block diagram illustrating an example wireless communication device in accordance with one or more implementations of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The wireless communication device 900 may comprise a radio-frequency (RF) antenna 910, a receiver 920, a transmitter 930, a baseband processing module 940, a memory 950, a processor 960, and a local oscillator generator (LO-GEN) 970. In various embodiments of the subject technology, one or more of the blocks represented in FIG. 9 may be integrated on one or more semiconductor substrates. For example, the blocks 920-970 may be realized in a single chip or a single system on chip, or may be realized in a multi-chip chipset.

The RF antenna 910 may be suitable for transmitting and/or receiving RF signals (e.g., wireless signals) over a wide range of frequencies (e.g., 60 GHz band). Although a single RF antenna 910 is illustrated, the subject technology is not so limited.

The receiver 920 may comprise suitable logic circuitry and/or code that may be operable to receive and process signals from the RF antenna 910. The receiver 920 may, for example, be operable to amplify and/or down-convert received wireless signals. In various embodiments of the subject technology, the receiver 920 may be operable to cancel noise in received signals and may be in close proximity to over a wide range of frequencies. In this manner, the receiver 920 may be suitable for receiving signals in accordance with a variety of wireless standards. Wi-Fi, WiMAX, Bluetooth, and various cellular standards. In various embodiments of the subject technology, the receiver 920 may not require any SAW filters and few or no off-chip discrete components such as large capacitors and inductors.

The transmitter 930 may comprise suitable logic circuitry and/or code that may be operable to process and transmit signals from the RF antenna 910. The transmitter 930 may, for example, be operable to up-convert baseband signals to RF signals and amplify RF signals. In various embodiments of the subject technology, the transmitter 930 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 930 may be operable to provide signals for further amplification by one or more power amplifiers. In some implementations, the transmitter 930 may include one or more RF feedback power amplifiers (e.g., 100 of FIG. 1) that are linearized using the RF feedback as described above.

The duplexer 912 may provide isolation in the transmit band to avoid saturation of the receiver 920 or damaging parts of the receiver 920, and to relax one or more design requirements of the receiver 920. Furthermore, the duplexer 912 may attenuate the noise in the receive band. The duplexer may be operable in multiple frequency bands of various wireless standards.

The baseband processing module 940 may comprise suitable logic, circuitry, interfaces, and/or code that may be operable to perform processing of baseband signals. The baseband processing module 940 may, for example, analyze received signals and generate control and/or feedback signals for configuring various components of the wireless communication device 900 such as the receiver 920. The baseband processing module 940 may be operable to encode, decode, transcode, modulate, demodulate, encrypt, decrypt, scramble, descramble, and/or otherwise process data in accordance with one or more wireless standards.

The processor 960 may comprise suitable logic, circuitry, and/or code that may enable processing data and/or controlling operations of the wireless communication device 900. In this regard, the processor 960 may be enabled to provide control signals to various other portions of the wireless communication device 900. The processor 960 may also control transfers of data between various portions of the wireless communication device 900. Additionally, the processor 960 may enable implementation of an operating system or otherwise execute code to manage operations of the wireless communication device 900.

The memory 950 may comprise suitable logic, circuitry, and/or code that may enable storage of various types of information such as received data, generated data, code, and/or configuration information. The memory 950 may comprise, for example, RAM, ROM, flash, and/or magnetic storage. In various embodiment of the subject technology, Information stored in the memory 950 may be utilized for configuring the receiver 920 and/or the baseband processing module 940.

The local oscillator generator (LOGEN) 970 may comprise suitable logic, circuitry, interfaces, and/or code that may be operable to generate one or more oscillating signals of one or more frequencies. The LOGEN 970 may be operable to generate digital and/or analog signals. In this manner, the LOGEN 970 may be operable to generate one or more clock signals and/or sinusoidal signals. Characteristics of the oscillating signals such as the frequency and duty cycle may be determined based on one or more control signals from, for example, the processor 960 and/or the baseband processing module 940.

In operation, the processor 960 may configure the various components of the wireless communication device 900 based on a wireless standard according to which it is desired to receive signals. Wireless signals may be received via the RF antenna 910 and amplified and down-converted by the receiver 920. The baseband processing module 940 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 950, and/or information affecting and/or enabling operation of the wireless communication device 900. The baseband processing module 940 may modulate, encode and perform other processing on audio, video, and/or control signals to be transmitted by the transmitter 930 in accordance to various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §§ 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A linearized power amplifier apparatus, the apparatus comprising:
   a plurality of amplifying stages configured to amplify a radio-frequency (RF) signal;
   a feedback loop formed by coupling a feedback circuit between an output port of a last amplifying stage and an input port of a first amplifying stage of the plurality of amplifying stages; and
   one or more tunable frequency-selective networks and a feedforward stage coupled to bypass one of the one or more tunable frequency-selective networks,
   wherein:
   the feedback loop is configured to have a loop gain frequency response that peaks at a frequency approximately equal to a frequency of the RF signal, and
   the feedback loop is configured to provide a linear combination of a feedback signal and the RF signal to the input port of the first amplifying stage.

2. The apparatus of claim 1, further comprising a linear, time-invariant, bandpass frequency-selective network coupled between two stages of the plurality of amplifying stages, wherein the linear, time-invariant, bandpass frequency-selective network comprises an LC tank.

3. The apparatus of claim 1, further comprising a tunable frequency-selective network coupled to the input port of the first amplifying, stage of the plurality of amplifying stages, wherein the tunable frequency-selective network comprises an LC tank circuit.

4. The apparatus of claim 1, wherein the feedback signal comprises a voltage signal, and the feedback circuit comprises at least one of a capacitor or a resistor.

5. The apparatus of claim 1, wherein the feedback signal comprises a combination of a voltage signal and a current signal, and the feedback loop comprises a current sensing circuit and at least one of a capacitor, a resistor or a transformer.

6. The apparatus of claim 5, wherein the current sensing circuit comprises one of a transformer or a bridge circuit, and wherein the current sensing circuit comprises a directional coupler.

7. The apparatus of claim 5, further comprising one or more tunable frequency-selective networks coupled between stages of the plurality of amplifying stages, wherein the tunable frequency-selective networks comprise LC tank circuits.

8. The apparatus of claim 1, wherein the feedforward stage is configured to enhance a stability of the plurality of amplifying stages.

9. The apparatus of claim 1, wherein the plurality of amplifying stages are implemented as a plurality of differential amplifier stages, and at least one stage of the plurality of differential amplifier stages is implemented using a complementary metal-oxide semiconductor (CMOS) cascode stage.

10. The apparatus of claim 1, further comprising an output network coupled to the output port of the last amplifying stage of the plurality of amplifying stages, and wherein the output network comprises a balun transformer, a Zobel network, or a reflection-less filter, and the output network is configured to enable a power dissipation to reduce a variation in a load impedance angle of a reactive load.

11. A method for providing a linearized power amplifier apparatus, the method comprising:
    providing a plurality of amplifying stages to amplify a radio-frequency (RF) signal, the plurality of amplifying stages including at least a first amplifying stage and a last amplifying stage;
    forming a feedback loop by coupling a feedback circuit between an output port of the last amplifying stage and an input port of the first amplifying stage;
    coupling, an output network including a balun transformer to the output port of the last amplifying stage;
    coupling a feedforward stage to bypass on of one or more tunable frequency-selective networks coupled between stages of the plurality of amplifying stages; and
    configuring the feedback loop to:
    provide a loop gain having a frequency response peaking at a frequency approximately equal to a frequency of the RF signal, and
    provide a linear combination of a feedback signal and the RF signal to the input port of the first amplifying stage,
    wherein the output network is out of the feedback loop.

12. The method of claim 11, further comprising coupling a linear, time-invariant, bandpass frequency-selective network between two stages of the plurality of amplifying stages, wherein the t linear, time-invariant, bandpass frequency-selective network comprises an LC tank.

13. The method of claim 11, further comprising coupling a tunable frequency-selective network to the input port of the first amplifying stage, wherein the tunable frequency-selective network comprises an LC tank circuit, and wherein the output network further comprises a Zobel network or a reflection-less filter.

14. The method of claim 11, wherein the feedback signal comprises a voltage signal, and forming the feedback loop comprises coupling at least one of a capacitor, a resistor or a transformer between an output port of the last amplifying stage and an input port of the first amplifying stage.

15. The method of claim 11, wherein the feedback signal comprises a combination of a voltage signal and a current signal, and forming the feedback loop comprises coupling a current sensing circuit and at least one of a capacitor a resistor, or a transformer between an output port of the last amplifying stage and an input port of the first amplifying stage.

16. The method of claim 15, further comprising coupling one or more tunable frequency-selective networks between amplifying stages of the plurality of amplifying stages, wherein the tunable frequency-selective networks comprise LC tank circuits.

17. The method of claim 16, further comprising configuring the feedforward stage to enhance a stability of the plurality of amplifying stages.

18. The method of claim 16, further comprising implementing the plurality of amplifying stages as a plurality of differential amplifier stages, and implementing at least one stage of the plurality of differential amplifier stages using a complementary metal-oxide semiconductor (CMOS) cascode stage.

19. A wireless communication device comprising:
    a transmitter configured to generate radio-frequency (RF) signal; and
    a linearized power amplifier circuit configured to amplify the RF signal, the linearized power amplifier circuit comprising:
    a plurality of amplifying stages including a first amplifying stage and a last amplifying stage;

a feedback loop including a feedback circuit coupled between an output port of the last amplifying stage and an input port of the first amplifying stage and configured to provide a linear combination of a feedback signal and the RF signal to the input port of the first amplifying stage;

one or more tunable frequency-selective networks and a feedforward stage coupled to bypass one of the one or more tunable frequency-selective networks; and an output network coupled to the output port of the last amplifying stage of the plurality of amplifying stages and out of the feedback loop, wherein the feedback loop is configured to have a loop gain frequency response that peaks at a frequency approximately equal to a frequency of the RF signal.

20. The wireless communication device of claim 19, further comprising coupling a linear, time-invariant, bandpass frequency-selective network between two amplifying stages of the plurality of amplifying stages, wherein the linear, time-invariant, bandpass frequency-selective network comprises an LC tank.

* * * * *

UNITED STATES PATENT AND TRADEMARK OFFICE
CERTIFICATE OF CORRECTION

PATENT NO. : 10,263,568 B2  
APPLICATION NO. : 15/801234  
DATED : April 16, 2019  
INVENTOR(S) : Jeffrey Norwood Harrison Page 1 of 1

It is certified that error appears in the above-identified patent and that said Letters Patent is hereby corrected as shown below:

On the Title Page (73) Assignee: "Avaga" should read --Avago--.

Signed and Sealed this  
Thirtieth Day of July, 2019

Andrei Iancu  
*Director of the United States Patent and Trademark Office*